(12) United States Patent
Kim et al.

(10) Patent No.: US 7,166,528 B2
(45) Date of Patent: Jan. 23, 2007

(54) METHODS OF SELECTIVE DEPOSITION OF HEAVILY DOPED EPITAXIAL SIGE

(75) Inventors: Yihwan Kim, Milpitas, CA (US);
Arkadii V. Samoilov, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 10/683,937

(22) Filed: Oct. 10, 2003

(65) Prior Publication Data
US 2005/0079691 A1    Apr. 14, 2005

(51) Int. Cl.
*H01L 21/44* (2006.01)
*H01L 21/336* (2006.01)

(52) U.S. Cl. .................. 438/607; 438/503; 438/481; 438/300

(58) Field of Classification Search ............. 438/481, 438/479, 607, 478, 198, 503, 300, 341
See application file for complete search history.

(56) References Cited

U.S. PATENT DOCUMENTS

| | | | |
|---|---|---|---|
| 4,834,831 A | 5/1989 | Nishizawa et al. ......... 156/611 |
| 5,112,439 A | 5/1992 | Reisman et al. | |
| 5,273,930 A * | 12/1993 | Steele et al. ............. 438/312 |
| 5,294,286 A | 3/1994 | Nishizawa et al. ......... 156/610 |
| 5,372,860 A | 12/1994 | Fehlner et al. .............. 427/578 |
| 5,374,570 A | 12/1994 | Nasu et al. .................... 437/40 |
| 5,469,806 A | 11/1995 | Mochizuki et al. ........... 117/97 |
| 5,480,818 A | 1/1996 | Matsumoto et al. ........... 437/40 |
| 5,527,733 A | 6/1996 | Nishizawa et al. .......... 437/160 |
| 5,674,304 A | 10/1997 | Fukada et al. ................ 65/32.4 |
| 5,693,139 A | 12/1997 | Nishizawa et al. ........... 117/89 |
| 5,796,116 A | 8/1998 | Nakata et al. ................ 257/66 |
| 5,807,792 A | 9/1998 | Ilg et al. ...................... 438/758 |

(Continued)

FOREIGN PATENT DOCUMENTS

EP        1 150 345        10/2001

(Continued)

OTHER PUBLICATIONS

Lee, et al., *Cyclic technique for the enhancement of highly oriented diamond film growt*, Elsevier Science S.A., Thin Solid Films (1997) 264-268.

(Continued)

*Primary Examiner*—Michael Trinh
(74) *Attorney, Agent, or Firm*—Patterson & Sheridan, LLP (57) ABSTRACT

The invention generally teaches a method for depositing a silicon film or silicon germanium film on a substrate comprising placing the substrate within a process chamber and heating the substrate surface to a temperature in the range from about 600° C. to about 900° C. while maintaining a pressure in the range from about 0.1 Torr to about 200 Torr. A deposition gas is provided to the process chamber and includes $SiH_4$, an optional germanium source gas, an etchant, a carrier gas and optionally at least one dopant gas. The silicon film or the silicon germanium film is selectively and epitaxially grown on the substrate. One embodiment teaches a method for depositing a silicon-containing film with an inert gas as the carrier gas. Methods may include the fabrication of electronic devices utilizing selective silicon germanium epitaxial films.

45 Claims, 2 Drawing Sheets

U.S. PATENT DOCUMENTS

| | | | |
|---|---|---|---|
| 5,906,680 A | 5/1999 | Meyerson | |
| 6,025,627 A | 2/2000 | Forbes et al. | 257/321 |
| 6,042,654 A | 3/2000 | Comita et al. | |
| 6,159,852 A | 12/2000 | Nuttall et al. | |
| 6,232,196 B1 | 5/2001 | Raaijmakers et al. | 438/386 |
| 6,235,568 B1* | 5/2001 | Murthy et al. | 438/231 |
| 6,284,686 B1 | 9/2001 | Marlor | 501/64 |
| 6,291,319 B1 | 9/2001 | Yu et al. | |
| 6,335,280 B1 | 1/2002 | van der Jeugd | |
| 6,348,420 B1 | 2/2002 | Raaijmakers et al. | 438/769 |
| 6,352,945 B1 | 3/2002 | Matsuki et al. | 438/778 |
| 6,358,829 B1 | 3/2002 | Yoon et al. | 438/597 |
| 6,383,955 B1 | 5/2002 | Matsuki et al. | 438/790 |
| 6,410,463 B1 | 6/2002 | Matsuki | 438/790 |
| 6,451,119 B1 | 9/2002 | Sneh et al. | |
| 6,458,718 B1 | 10/2002 | Todd | 438/778 |
| 6,489,241 B1 | 12/2002 | Thilderkvist et al. | |
| 6,544,900 B1 | 4/2003 | Raaijmakers et al. | |
| 6,559,520 B1 | 5/2003 | Matsuki et al. | |
| 6,562,720 B1 | 5/2003 | Thilderkvist et al. | |
| 6,797,558 B1 | 9/2004 | Nuttall et al. | |
| 6,821,825 B1 | 11/2004 | Todd | |
| 2001/0020712 A1 | 9/2001 | Raaijmakers et al. | 257/301 |
| 2001/0024871 A1 | 9/2001 | Yagi | 438/604 |
| 2001/0045604 A1* | 11/2001 | Oda et al. | 257/350 |
| 2001/0046567 A1 | 11/2001 | Matsuki et al. | 427/578 |
| 2001/0055672 A1 | 12/2001 | Todd | 428/212 |
| 2002/0090818 A1 | 7/2002 | Thilderkvist et al. | |
| 2002/0093042 A1 | 7/2002 | Oh et al. | 257/303 |
| 2002/0142557 A1* | 10/2002 | Hashimoto et al. | 438/309 |
| 2002/0145168 A1 | 10/2002 | Bojarczuk, Jr. et al. | |
| 2002/0168868 A1 | 11/2002 | Todd | 438/767 |
| 2002/0173113 A1 | 11/2002 | Todd | 438/398 |
| 2002/0173130 A1 | 11/2002 | Pomerede et al. | 438/592 |
| 2002/0197831 A1 | 12/2002 | Todd et al. | 438/528 |
| 2003/0022528 A1 | 1/2003 | Todd | 438/933 |
| 2003/0036268 A1 | 2/2003 | Brabant et al. | |
| 2003/0082300 A1 | 5/2003 | Todd et al. | 427/255.27 |
| 2003/0189208 A1 | 10/2003 | Law et al. | |
| 2004/0033674 A1 | 2/2004 | Todd | |
| 2004/0226911 A1 | 11/2004 | Dutton et al. | |
| 2004/0253776 A1 | 12/2004 | Hoffmann et al. | |
| 2005/0045905 A1* | 3/2005 | Chu et al. | 257/103 |
| 2005/0079691 A1 | 4/2005 | Kim et al. | |

FOREIGN PATENT DOCUMENTS

| | | |
|---|---|---|
| JP | 58098917 | 6/1983 |
| JP | 62-171999 | 7/1987 |
| JP | 63062313 | 3/1988 |
| JP | 01-270593 | 10/1989 |
| JP | 02-172895 | 7/1990 |
| JP | 03-286522 | 12/1991 |
| JP | 05-047665 | 2/1993 |
| JP | 5102189 | 4/1993 |
| JP | 2001-111000 | 4/2001 |
| JP | 2001-189312 | 5/2001 |
| JP | 2001-189312 | 7/2001 |
| WO | WO 98/20524 | 5/1998 |
| WO | WO 01/41544 A2 | 6/2001 |
| WO | WO 02/064853 A2 | 8/2002 |
| WO | WO 02/065508 A2 | 8/2002 |
| WO | WO 02/065516 A2 | 8/2002 |
| WO | WO 02/065517 A2 | 8/2002 |
| WO | WO 02/065525 A1 | 8/2002 |
| WO | WO 02/080244 A2 | 10/2002 |
| WO | WO 02/097864 A2 | 12/2002 |
| WO | WO 2005/038890 A1 | 4/2005 |

OTHER PUBLICATIONS

Choi, et al., *Stability of TiB$_2$ as a Diffusion Barrier on Silicon*. Electrochemical Society vol. 138 No. 10 Oct. 1991.

Paranjpe, et al., *Atomic Layer Deposition of AlO$_x$ for Thin Film Head Gap Applications*, ECS, Journal of the Electrochemical Society, 148 (9) G465-G471 (2001).

Article by Uchino et al., entitled "A Raised Source/Drain Technology Using In-situ P-doped SiGe and B-doped Si for 0.1-μm CMOS ULSIs", IEDM, Dec. 1997, Technical Digest, pp. 479-482.

Article by Sedgwick et al., entitled "Selective SiGe and heavily as doped Si deposited at low temperature by atmospheric pressure chemical vapor deposition", Journal of Vacuum Science & Technology, May/Jun. 1993, No. 3, pp. 1124-1128.

Article by Kamins et al., entitled "Kinetics of Selective epitaxial deposition Si$_{1-x}$Ge$_x$", American Institute of Physics, Aug. 1992, No. 6, pp. 669-671.

Article by Menon et al., entitled "Loading effect in SiGe layers grown by dichlorosilane-and silane-based epitaxy", American Institute of Physics, Nov. 2001, vol. 90, No. 9, pp. 4805-4809.

International Search Report mailed Feb. 22, 2005 for PCT/US2004/030872 (AMAT/8539-PCT).

Jeong, et al. "Growth and Characterization of Aluminum Oxide (Al$_2$O$_3$) Thin Films by Plasma-Assisted Atomic Layer Controlled Deposition," J. Korean Inst. Met. Mater., vol. 38, No. 10, Oct. 2000 pp. 1395-1399.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001 pp. 285-289.

Invitation to Pay Additional Fees and Partial International Search Report for PCT/US2005/016160 Feb. 8, 2006, 6 pages.

International Search Report dated Mar. 30, 2006 for International Application No. PCT/US2005/016160 (APPM/008539PC02), 10 pages.

Written Opinion of the International Searching Authority dated Mar. 30, 2006 for International Application No. PCT/US2005/016160 (APPM/008539PC02), 12 pages.

* cited by examiner

METHODS OF SELECTIVE DEPOSITION OF HEAVILY DOPED EPITAXIAL SIGE

BACKGROUND OF THE INVENTION

1. Field of the Invention

Embodiments of the invention generally relate to the field of semiconductor manufacturing processes and devices, more particular, to methods of depositing silicon-containing films forming semiconductor devices.

2. Description of the Related Art

As smaller transistors are manufactured, ultra shallow source/drain junctions are becoming more challenging to produce. According to the International Technology Roadmap for Semiconductors (ITRS), junction depth is required to be less than 30 nm for sub-100 nm CMOS (complementary metal-oxide semiconductor) devices. Conventional doping by implantation and annealing is less effective as the junction depth approaches 10 nm. Doping by implantation requires a post-annealing process in order to activate dopants and post-annealing causes enhanced dopant diffusion into layers.

Recently, heavily-doped (about >$10^{19}$ atoms/cm$^3$), selective SiGe epitaxy has become a useful material to deposit during formation of elevated source/drain and source/drain extension features. Source/drain extension features are manufactured by etching silicon to make a recessed source/drain feature and subsequently filling the etched surface with a selectively grown SiGe epilayer. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction.

Selective Si epitaxial deposition and SiGe epitaxial deposition permits growth of epilayers on Si moats with no growth on dielectric areas. Selective epitaxy can be used in semiconductor devices, such as within elevated source/drains, source/drain extensions, contact plugs, and base layer deposition of bipolar devices. Generally, a selective epitaxy process involves two reactions: deposition and etching. They occur simultaneously with relatively different reaction rates on Si and on dielectric surface. A selective process window results in deposition only on Si surfaces by changing the concentration of an etchant gas (e.g., HCl). A popular process to perform selective, epitaxy deposition is to use dichlorosilane (SiH$_2$Cl$_2$) as a silicon source, germane (GeH$_4$) as a germanium source, HCl as an etchant to provide selectivity during the deposition and hydrogen (H$_2$) as a carrier gas.

Although SiGe epitaxial deposition is suitable for small dimensions, this approach does not readily prepare doped SiGe, since the dopants react with HCl. The process development of heavily boron doped (e.g., higher than 5×$10^{19}$ cm$^{-3}$) selective SiGe epitaxy is a much more complicated task because boron doping makes the process window for selective deposition narrow. Generally, when more boron concentration (e.g., B$_2$H$_6$) is added to the flow, a higher HCl concentration is necessary to achieve selectivity due to the increase growth rate of deposited film(s) on any dielectric areas. This higher HCl flow rate proportionally reduces boron incorporation into the epilayers presumably because the B—Cl bond is stronger than Ge—Cl and Si—Cl bonds.

Therefore, there is a need to have a process for selectively and epitaxially depositing silicon and silicon compounds with an enriched dopant concentration. Furthermore, the process must maintain a high growth of the deposited material. Also, the process must have less dependency on germanium and boron concentrations in the silicon compound in relation to an etchant flow rate.

SUMMARY OF THE INVENTION

In one embodiment, the invention generally provides a method of depositing a silicon germanium film on a substrate comprising placing the substrate within a process chamber and heating the substrate surface to a temperature in a range from about 500° C. to about 900° C. while maintaining a pressure in a range from about 0.1 Torr to about 200 Torr. A deposition gas is provided to the process chamber and includes SiH$_4$, GeH$_4$, HCl, a carrier gas and at least one dopant gas, such as diborane, arsine or phosphine. A doped silicon germanium film is epitaxially grown on the substrate.

In another embodiment, the invention generally provides a selective epitaxial method for growing a doped silicon germanium film on a substrate comprising placing the substrate within a process chamber at a pressure in a range from about 0.1 Torr to about 200 Torr and heating the substrate surface to a temperature in a range from about 500° C. to about 900° C. A deposition gas is provided to the process chamber and includes SiH$_4$, a germanium source, an etchant source, a carrier gas and at least one dopant gas. The silicon germanium film is grown with a dopant concentration in a range from about 1×$10^{20}$ atoms/cm$^3$ to about 2.5×$10^{21}$ atoms/cm$^3$.

In another embodiment, the invention generally provides a selective epitaxial method for growing a silicon-containing film on a substrate comprising placing the substrate within a process chamber at a pressure in a range from about 0.1 Torr to about 200 Torr and heating the substrate surface to a temperature in a range from about 500° C. to about 900° C. A deposition gas is provided to the process chamber and includes SiH$_4$, HCl and a carrier. The silicon-containing film is grown at a rate between about 50 Å/min and about 600 Å/min.

In another embodiment, the invention generally provides a selective epitaxial method for growing a silicon-containing film on a substrate comprising placing the substrate within a process chamber at a pressure in a range from about 0.1 Torr to about 200 Torr, heating the substrate to a temperature in a range from about 500° C. to about 900° C., providing a deposition gas comprising Cl$_2$SiH$_2$, HCl and a carrier gas and depositing a silicon-containing layer on the substrate. The method further comprises providing a second deposition gas comprising SiH$_4$, HCl and a second carrier gas and depositing a second silicon-containing layer on the silicon-containing layer.

In another embodiment, the invention generally provides a method of selectively depositing a silicon-containing film on a substrate comprising placing the substrate within a process chamber, heating the substrate to a temperature in a range from about 500° C. to about 900° C. and maintaining a pressure in a range from about 0.1 Torr to about 200 Torr. The method further comprises providing a deposition gas comprising a silicon-containing gas, a germanium source, HCl, at least one dopant gas and a carrier gas selected from the group consisting of N$_2$, Ar, He and combinations thereof and depositing the silicon-containing film epitaxially on the substrate

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention provides a process to epitaxially deposit silicon containing compounds during the manufacture of various device structures. In some embodiments, the process utilizes the silicon precursor silane ($SiH_4$) during the deposition of silicon compounds. While past techniques usually have used silicon precursors such as dichlorosilane, tetrachlorosilane or hexachlorodisilane, processes of the present invention teach the utilization of silane as a precursor. The use of silane has been found to deposit silicon containing films more quickly than that of dichlorosilane. Also, the use of silane during these processes provides a higher degree of control for dopant concentrations within the film and increased deposition rate.

Embodiments of the present invention teach processes to grow films of selective, epitaxial silicon compounds. Selective silicon containing film growth generally is conducted when the substrate or surface includes more than one material, such as exposed single crystalline silicon surface areas and features that are covered with dielectric material, such as oxide or nitride layers. Usually, these features are dielectric material. Selective epitaxial growth to the crystalline, silicon surface is achieved while the feature is left bare, generally, with the utilization of an etchant (e.g., HCl). The etchant removes amorphous silicon or polysilicon growth from features quicker than the etchant removes crystalline silicon growth from the substrate, thus selective epitaxial growth is achieved.

Carrier gases are used throughout the processes and include $H_2$, Ar, $N_2$, He and combinations thereof. In one example, $H_2$ is used as a carrier gas. In another example $N_2$ is used as a carrier gas. In one embodiment, a carrier gas during an epitaxial deposition process is conducted with neither $H_2$ nor atomic hydrogen. However, an inert gas is used as a carrier gas, such as $N_2$, Ar, He and combinations thereof. Carrier gases may be combined in various ratios during some embodiments of the process.

In one embodiment, a carrier gas includes $N_2$ and/or Ar to maintain available sites on the silicon compound film. The presence of hydrogen on the silicon compound surface limits the number of available sites (i.e., passivates) for Si or SiGe to grow when an abundance of $H_2$ is used as a carrier gas. Consequently, a passivated surface limits the growth rate at a given temperature, particularly at lower temperatures (e.g., <650° C.). Therefore, a carrier gas of $N_2$ and/or Ar may be used during a process at lower temperature and reduce the thermal budget without sacrificing growth rate.

In one embodiment of the invention, a silicon compound film is epitaxially grown as a Si film. A substrate (e.g., 300 mm OD) containing a semiconductor feature is placed into the process chamber. During this deposition technique, silicon precursor (e.g., silane) is flown concurrently into the process chamber with a carrier gas (e.g., $H_2$ and/or $N_2$) and an etchant (e.g., HCl). The flow rate of the silane is in the range from about 5 sccm to about 500 sccm. The flow rate of the carrier gas is from about 1,000 sccm to about 60,000 sccm. The flow rate of the etchant is from about 5 sccm to about 1,000 sccm. The process chamber is maintained with a pressure from about 0.1 Torr to about 200 Torr, preferably at about 15 Torr. The substrate is kept at a temperature in the range from about 500° C. to about 1,000° C., preferably from about 600° C. to about 900° C. for example, from 600° C. to 750° C., for another example from 650° C. to 800° C. The mixture of reagents is thermally driven to react and epitaxially deposit crystalline silicon. The HCl etches any deposited amorphous silicon or polycrystalline silicon from dielectric features upon the surface of the substrate. The process is conducted to form the deposited silicon compound with a thickness in a range from about 100 Å to about 3,000 Å and at a deposition rate between about 50 Å/min and about 600 Å/min, preferably at about 150 Å/min. In one embodiment, the silicon compound has a thickness greater than 500 Å, such as about 1,000 Å.

Etchants are utilized to control the areas on the device to be free of deposited silicon compound. Etchants that are useful during deposition processes of the invention include HCl, HF, HBr, $Si_2Cl_6$, $SiCl_4$, $Cl_2SiH_2$, $CCl_4$, $Cl_2$ and combinations thereof. Other silicon precursors, besides silane, that are useful while depositing silicon compounds include higher silanes and organosilanes. Higher silanes include the compounds with the empirical formula $Si_xH_{(2x+2)}$, such as disilane ($Si_2H_6$), trisilane ($Si_3H_8$) and tetrasilane ($Si_4H_{10}$), as well as others. Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources and carbon sources during embodiments of the present invention to incorporate carbon in to deposited silicon compound.

In another embodiment of the invention, a silicon compound film is epitaxially grown as a SiGe film. A substrate (e.g., 300 mm OD) containing a semiconductor feature is placed into the process chamber. During this deposition technique, silicon precursor (e.g., silane) is flown concurrently into the process chamber with a carrier gas (e.g., $H_2$ and/or $N_2$), a germanium source (e.g., $GeH_4$) and an etchant (e.g., HCl). The flow rate of the silane is in the range from about 5 sccm to about 500 sccm. The flow rate of the carrier gas is from about 1,000 sccm to about 60,000 sccm. The flow rate of the germanium source is from about 0.1 sccm to about 10 sccm. The flow rate of the etchant is from about 5 sccm to about 1,000 sccm. The process chamber is maintained with a pressure from about 0.1 Torr to about 200 Torr, preferably at about 15 Torr. The substrate is kept at a temperature in the range from about 500° C. to about 1,000° C., preferably from about 700° C. to about 900° C. The reagent mixture is thermally driven to react and epitaxially deposit a silicon compound, namely a silicon germanium film. The HCl etches any deposited amorphous SiGe compounds from dielectric features upon the surface of the substrate. The process is conducted to form the deposited SiGe compound with a thickness in a range from about 100 Å to about 3,000 Å and at a deposition rate between about 50 Å/min and about 300 Å/min, preferably at about 150 Å/min. The germanium concentration is in the range from about 1 atomic percent to about 30 atomic percent of the SiGe compound, preferably at about 20 atomic percent.

Other germanium sources or precursors, besides germane, that are useful while depositing silicon compounds include higher germanes and organogermanes. Higher germanes include the compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds with the empirical formula $R_yGe_xH_{(2x+2-y)}$, where R=methyl, ethyl, propyl or butyl, such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). Germanes and organogermane compounds have been found to be an advantageous germanium sources and carbon sources during embodiments of the present invention to incorporate germanium and carbon in to the deposited silicon compounds, namely SiGe and SiGeC compounds.

In one embodiment of the invention, a silicon compound film is epitaxially grown as a doped Si film. A substrate (e.g., 300 mm OD) containing a semiconductor feature is placed into the process chamber. During this deposition technique, silicon precursor (e.g., silane) is flown concurrently into the process chamber with a carrier gas (e.g., $H_2$ and/or $N_2$), a dopant (e.g., $B_2H_6$) and an etchant (e.g., HCl). The flow rate of the silane is in the range from about 5 sccm to about 500 sccm. The flow rate of the carrier gas is from about 1,000 sccm to about 60,000 sccm. The flow rate of the dopant is from about 0.01 sccm to about 3 sccm. The flow rate of the etchant is from about 5 sccm to about 1,000 sccm. The process chamber is maintained with a pressure from about 0.1 Torr to about 200 Torr, preferably at about 15 Torr. The substrate is kept at a temperature in the range from about 500° C. to about 1,000° C., preferably from about 700° C. to about 900° C. The mixture of reagents is thermally driven to react and epitaxially deposit doped silicon films. The HCl etches any deposited amorphous silicon or polycrystalline silicon from dielectric features upon the surface of the substrate. The process is conducted to form the deposited, doped silicon compound with a thickness in a range from about 100 Å to about 3,000 Å and at a deposition rate between about 50 Å/min and about 600 Å/min, preferably at about 150 Å/min.

Dopants provide the deposited silicon compounds with various conductive characteristics, such as directional electron flow in a controlled and desired pathway required by the electronic device. Films of the silicon compounds are doped with particular dopants to achieve the desired conductive characteristic. In one embodiment, the silicon compound is doped p-type, such as by using diborane to add boron at a concentration in the range from about $10^{15}$ atoms/cm$^3$ to about $10^{21}$ atoms/cm$^3$. In one embodiment, the p-type dopant has a concentration of at least $5\times10^{19}$ atoms/cm$^3$. In another embodiment, the p-type dopant is in the range from about $1\times10^{20}$ atoms/cm$^3$ to about $2.5\times10^{21}$ atoms/cm$^3$. In another embodiment, the silicon compound is doped n-type, such as with phosphorus and/or arsenic to a concentration in the range from about $10^{15}$ atoms/cm$^3$ to about $10^{21}$ atoms/cm$^3$.

Besides diborane, other boron containing dopants include boranes and organoboranes. Boranes include borane, triborane, tetraborane and pentaborane, while alkylboranes include compounds with the empirical formula $R_xBH_{(3-x)}$, where R=methyl, ethyl, propyl or butyl and x=0, 1, 2 or 3. Alkylboranes include trimethylborane (($CH_3$)$_3B$), dimethylborane (($CH_3$)$_2BH$), triethylborane (($CH_3CH_2$)$_3B$) and diethylborane (($CH_3CH_2$)$_2BH$). Dopants also include arsine ($AsH_3$), phosphine ($PH_3$) and alkylphosphines, such as with the empirical formula $R_xPH_{(3-x)}$, where R=methyl, ethyl, propyl or butyl and x=0, 1, 2 or 3. Alkylphosphines include trimethylphosphine (($CH_3$)$_3P$), dimethylphosphine (($CH_3$)$_2PH$), triethylphosphine (($CH_3CH_2$)$_3P$) and diethylphosphine (($CH_3CH_2$)$_2PH$).

In another embodiment of the invention, a silicon compound film is epitaxially grown to produce a doped SiGe. A substrate (e.g., 300 mm OD) containing a semiconductor feature is placed into the process chamber. During this deposition technique, silicon precursor (e.g., silane) is flown concurrently into the process chamber with a carrier gas (e.g., $H_2$ and/or $N_2$), a germanium source (e.g., $GeH_4$), a dopant (e.g., $B_2H_6$) and an etchant (e.g., HCl). The flow rate of the silane is in the range from about 5 sccm to about 500 sccm. The flow rate of the carrier gas is from about 1,000 sccm to about 60,000 sccm. The flow rate of the germanium source is from about 0.1 sccm to about 10 sccm. The flow rate of the dopant is from about 0.01 sccm to about 3 sccm. The flow rate of the etchant is from about 5 sccm to about 1,000 sccm. The process chamber is maintained with a pressure from about 0.1 Torr to about 200 Torr, preferably at about 15 Torr. The substrate is kept at a temperature in the range from about 500° C. to about 1,000° C., preferably from about 700° C. to about 900° C. The reagent mixture is thermally driven to react and epitaxially deposit a silicon compound, namely a silicon germanium film. The HCl etches any deposited amorphous SiGe from features upon the surface of the substrate. The process is conducted to form the doped SiGe compound with a thickness in a range from about 100 Å to about 3,000 Å and at a rate between about 50 Å/min and about 600 Å/min, preferably at about 150 Å/min. The germanium concentration is in the range from about 1 atomic percent to about 30 atomic percent of the SiGe compound, preferably at about 20 atomic percent. The boron concentration is in the range from about $1\times10^{20}$ atoms/cm$^3$ to about $2.5\times10^{21}$ atoms/cm$^3$ of the SiGe compound, preferably at about $2\times10^{20}$ atoms/cm$^3$.

In another embodiment of the invention, a silicon compound film is epitaxially grown as a SiGeC film. A substrate (e.g., 300 mm OD) containing a semiconductor feature is placed into the process chamber. During this deposition technique, silicon precursor (e.g., silane) is flown concurrently into the process chamber with a carrier gas (e.g., $H_2$ and/or $N_2$), a germanium source (e.g., $GeH_4$), a carbon source (e.g., $CH_3SiH_3$) and an etchant (e.g., HCl). The flow rate of the silane is in the range from about 5 sccm to about 500 sccm. The flow rate of the carrier gas is from about 1,000 sccm to about 60,000 sccm. The flow rate of the germanium source is from about 0.1 sccm to about 10 sccm. The flow rate of the carbon source is from about 0.1 sccm to about 50 sccm. The flow rate of the etchant is from about 5 sccm to about 1,000 sccm. The process chamber is maintained with a pressure from about 0.1 Torr to about 200 Torr, preferably at about 15 Torr. The substrate is kept at a temperature in the range from about 500° C. to about 1,000° C., preferably from about 500° C. to about 700° C. The reagent mixture is thermally driven to react and epitaxially deposit a silicon compound, namely a silicon germanium carbon film. The HCl etches any deposited amorphous or polycrystalline SiGeC compounds from dielectric features upon the surface of the substrate. The process is conducted to form the deposited SiGeC compound with a thickness in a range from about 100 Å to about 3,000 Å and at a deposition rate between about 50 Å/min and about 600 Å/min, preferably at about 150 Å/min. The germanium concentration is in the range from about 1 atomic percent to about 30 atomic percent of the SiGeC compound, preferably at about 20 atomic percent. The carbon concentration is in the range from about 0.1 atomic percent to about 5 atomic percent, preferably at about 2 atomic percent of the SiGeC compound.

Other carbon sources or precursors, besides ethylene or methane, are useful while depositing silicon compounds and include alkyls, alkenes and alkynes of ethyl, propyl and butyl. Such carbon sources include ethyne ($C_2H_2$), propane ($C_3H_8$), propene ($C_3H_6$), butyne ($C_4H_6$), as well as others. Other carbon sources include organosilane compounds, as described in relation to silicon sources.

In another embodiment of the invention, a silicon compound film is epitaxially grown as a doped-SiGeC film. A substrate (e.g., 300 mm OD) containing a semiconductor feature is placed into the process chamber. During this deposition technique, silicon precursor (e.g., silane) is flown concurrently into the process chamber with a carrier gas (e.g., $H_2$ and/or $N_2$), a germanium source (e.g., $GeH_4$), a carbon source (e.g., $CH_3SiH_3$), a dopant (e.g., $B_2H_6$) and an etchant (e.g., HCl). The flow rate of the silane is in the range from about 5 sccm to about 500 sccm. The flow rate of the carrier gas is from about 1,000 sccm to about 60,000 sccm. The flow rate of the germanium source is from about 0.1 sccm to about 10 sccm. The flow rate of the carbon source is from about 0.1 sccm to about 50 sccm. The flow rate of the dopant is from about 0.01 sccm to about 3 sccm. The flow rate of the etchant is from about 5 sccm to about 1,000 sccm. The process chamber is maintained with a pressure from about 0.1 Torr to about 200 Torr, preferably at about 15 Torr. The substrate is kept at a temperature in the range from about 500° C. to about 1,000° C., preferably from about 500° C. to about 700° C. The reagent mixture is thermally driven to react and epitaxially deposit a silicon compound, namely a doped silicon germanium carbon film. The HCl etches any deposited amorphous or polycrystalline SiGeC compounds from dielectric features upon the surface of the substrate. The process is conducted to form the deposited SiGeC compound with a thickness in a range from about 100 Å to about 3,000 Å and at a deposition rate between about 50 Å/min and about 600 Å/min, preferably at about 150 Å/min. The germanium concentration is in the range from about 1 atomic percent to about 30 atomic percent of the SiGeC compound, preferably at about 20 atomic percent. The carbon concentration is in the range from about 0.1 atomic percent to about 5 atomic percent of the SiGeC compound, preferably at about 2 atomic percent. The boron concentration is in the range from about $1 \times 10^{20}$ atoms/cm$^3$ to about $2.5 \times 10^{21}$ atoms/cm$^3$ of the SiGe compound, preferably at about $2 \times 10^{20}$ atoms/cm$^3$.

In another embodiment of the invention, a second silicon compound film is epitaxially grown as a SiGe film by using dichlorosilane, subsequently to depositing any of the silicon compounds as described above via silane as a silicon source. A substrate (e.g., 300 mm OD) containing any of the above described silicon containing compounds is placed into the process chamber. During this deposition technique, silicon precursor (e.g., $Cl_2SiH_2$) is flown concurrently into the process chamber with a carrier gas (e.g., $H_2$ and/or $N_2$), a germanium source (e.g., $GeH_4$) and an etchant (e.g., HCl). The flow rate of the dichlorosilane is in the range from about 5 sccm to about 500 sccm. The flow rate of the carrier gas is from about 1,000 sccm to about 60,000 sccm. The flow rate of the germanium source is from about 0.1 sccm to about 10 sccm. The flow rate of the etchant is from about 5 sccm to about 1,000 sccm. The process chamber is maintained with a pressure from about 0.1 Torr to about 200 Torr, preferably at about 15 Torr. The substrate is kept at a temperature in the range from about 500° C. to about 1,000° C., preferably from about 700° C. to about 900° C. The reagent mixture is thermally driven to react and epitaxially deposit a second silicon compound, namely a silicon germanium film. The HCl etches any deposited amorphous or polycrystalline SiGe compounds from any dielectric features upon the surface of the substrate. The process is conducted to form the deposited SiGe compound with a thickness in a range from about 100 Å to about 3,000 Å and at a deposition rate between about 10 Å/min and about 100 Å/min, preferably at about 50 Å/min. The germanium concentration is in the range from about 1 atomic percent to about 30 atomic percent of the SiGe compound, preferably at about 20 atomic percent. This embodiment describes a process to deposit a SiGe film, though substitution of silane with dichlorosilane to any of the previously described embodiments will produce a second silicon containing film. In another embodiment, a third silicon containing layer is deposited using any of the silane based process discussed above.

Therefore, in one embodiment, a silicon compound laminate film may be deposited in sequential layers of silicon compound by altering the silicon precursor between silane and dichlorosilane. In one example, a laminate film of about 2,000 Å is formed by depositing four silicon compound layers (each of about 500 Å), such that the first and third layers are deposited using dichlorosilane and the second and fourth layers are deposited using silane. In another aspect of a laminate film, the first and third layers are deposited using silane and the second and fourth layers are deposited using dichlorosilane. The thickness of each layer is independent from each other; therefore, a laminate film may have various thicknesses of the silicon compound layers.

In one embodiment, dichlorosilane is used to deposit the silicon compound layer when the previous layer contains surface islands (e.g., contamination or irregularity to film). A process incorporating dichlorosilane may be less sensitive to the surface islands while depositing the silicon compound layer over the previous layer. The use of dichlorosilane as the silicon source has a high horizontal or lateral growth rate relative to the use of silane. Once the surface island is covered and the silicon compound layer has a consistent surface, dichlorosilane is replaced with silane and deposition of the silicon compound layer is continued.

Embodiments of the invention teach processes to deposit silicon compounds on many substrates and surfaces. Substrates on which embodiments of the invention may be useful include, but are not limited to semiconductor wafers, such as crystalline silicon (e.g., Si<100> and Si<111>), silicon oxide, silicon germanium, doped or undoped wafers and patterned or non-patterned wafers. Substrates have a variety of geometries (e.g., round, square and rectangular) and sizes (e.g., 200 mm OD, 300 mm OD). Surfaces and/or substrates include wafers, films, layers and materials with dielectric, conductive and barrier properties and include polysilicon, silicon on insulators (SOI), strained and unstrained lattices. Pretreatment of surfaces includes polishing, etching, reduction, oxidation, hydroxylation, annealing and baking. In one embodiment, wafers are dipped into a 1% HF solution, dried and baked in a hydrogen atmosphere at 800° C.

In one embodiment, silicon compounds include a germanium concentration within the range from about 0 atomic percent to about 95 atomic percent. In another embodiment, a germanium concentration is within the range from about 1 atomic percent to about 30 atomic percent, preferably from about 15 atomic percent to about 25 atomic percent and more preferably at about 20 atomic percent. Silicon compounds also include a carbon concentration within the range from about 0 atomic percent to about 5 atomic percent. In other aspects, a carbon concentration is within the range from about 200 ppm to about 2 atomic percent.

The silicon compound films of germanium and/or carbon are produced by various processes of the invention and can have consistent, sporadic or graded elemental concentrations. Graded silicon germanium films are disclosed in U.S. patent applications 20020174826 and 20020174827 assigned to Applied Material, Inc., and are incorporated herein by reference in entirety for the purpose of describing methods of depositing graded silicon compound films. In one embodiment, silane and a germanium source (e.g., $GeH_4$) are used to deposit silicon germanium containing films. In this embodiment, the ratio of silane and germanium source can be varied in order to provide control of the elemental concentrations while growing graded films. In another embodiment, silane and a carbon source (e.g., $CH_3SiH_3$) are used to deposit silicon carbon containing films. The ratio of silane and carbon source can be varied in order to provide control of the elemental concentration while growing homogenous or graded films. In another embodiment, silane, a germanium source (e.g., $GeH_4$) and a carbon source (e.g., $CH_3SiH_3$) are used to deposit silicon germanium carbon containing films. The ratio of silane, germanium and carbon source can be varied in order to provide control of the elemental concentration while growing homogenous or graded films.

In processes of the invention, silicon compound films are grown by chemical vapor deposition (CVD) processes, wherein CVD processes include atomic layer deposition (ALD) processes and/or atomic layer epitaxy (ALE) processes. Chemical vapor deposition includes the use of many techniques, such as plasma-assisted CVD (PA-CVD), atomic layer CVD (ALCVD), organometallic or metalorganic CVD (OMCVD or MOCVD), laser-assisted CVD (LA-CVD), ultraviolet CVD (UV-CVD), hot-wire (HWCVD), reduced-pressure CVD (RP-CVD), ultra-high vacuum CVD (UHV-CVD) and others. In one embodiment, the preferred process of the present invention is to use thermal CVD to epitaxially grow or deposit the silicon compound, whereas the silicon compound includes silicon, SiGe, SiC, SiGeC, doped variants thereof and combinations thereof.

The processes of the invention can be carried out in equipment known in the art of ALE, CVD and ALD. The apparatus brings the sources into contact with a heated substrate on which the silicon compound films are grown. The processes can operate at a range of pressures from about 1 mTorr to about 2,300 Torr, preferably between about 0.1 Torr and about 200 Torr. Hardware that can be used to deposit silicon-containing films includes the Epi Centura® system and the Poly Gen® system available from Applied Materials, Inc., located in Santa Clara, Calif. An ALD apparatus is disclosed in U.S. patent application 20030079686, assigned to Applied Material, Inc., and entitled "Gas Delivery Apparatus and Methods for ALD", and is incorporated herein by reference in entirety for the purpose of describing the apparatus. Other apparatuses include batch, high-temperature furnaces, as known in the art.

Figure 1A:
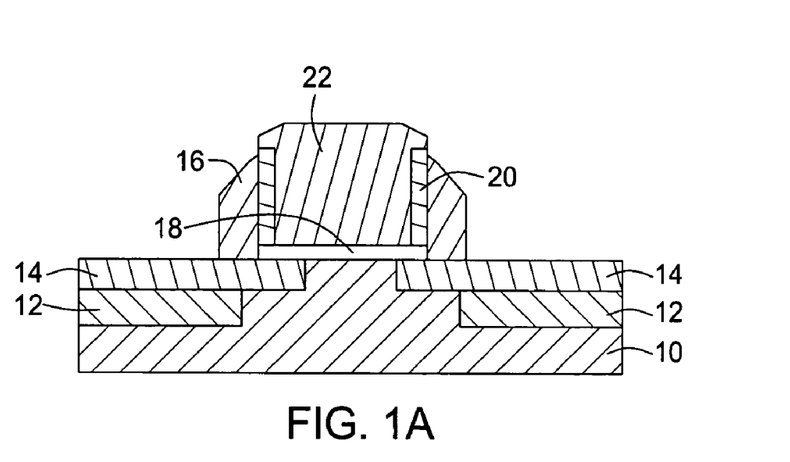
FIGS. 1A–C show several devices with epitaxially deposited silicon-containing layer.
Figure 1B:
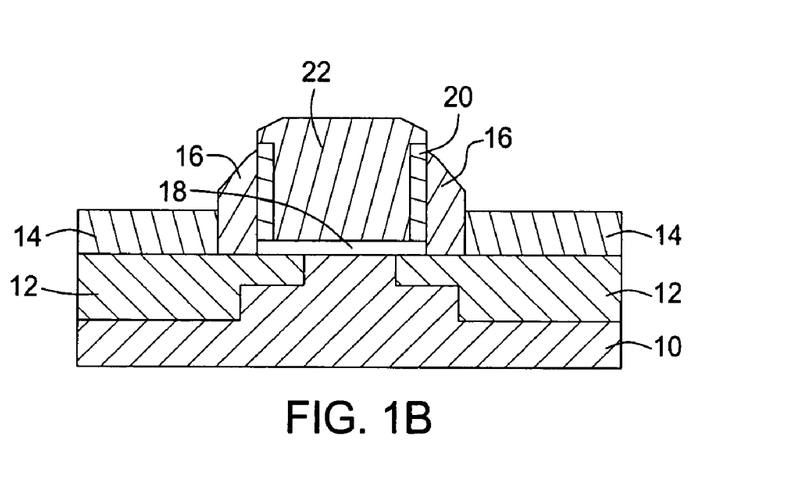
Figure 1C:
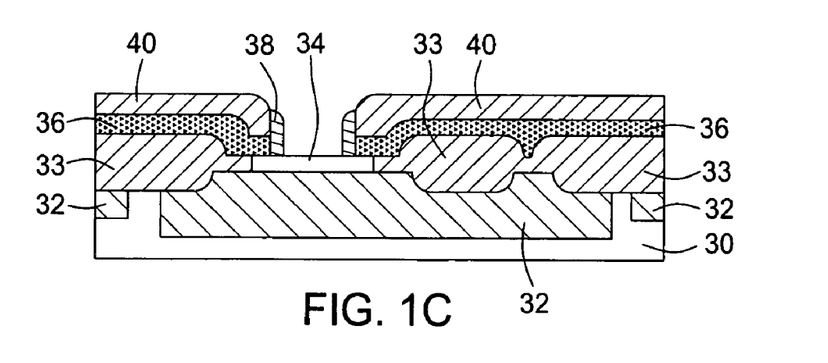

The processes are extremely useful while depositing silicon compound layers in Metal-Oxide-Semiconductor Field Effect Transistor (MOSFET) and bipolar transistors as depicted in FIGS. 1A–1C. Herein, silicon compounds are the deposited layers or films and include Si, SiGe, SiC, SiGeC, doped variants thereof and combinations thereof, epitaxially grown during the processes of the present invention. The silicon compounds include strained or unstrained layers within the films.

FIGS. 1A–1B show the epitaxially grown silicon compound on a MOSFET. The silicon compound is deposited to the source/drain features of the device. The silicon compound adheres and grows from the crystal lattice of the underlying layer and maintains this arrangement as the silicon compound grows with thickness. In one embodiment, FIG. 1A demonstrates the silicon compound deposited as a source/drain extension source, while in another embodiment, FIG. 1B shows the silicon compound deposited as an elevated source/drain (ESD).

The source/drain layer 12 is formed by ion implantation of the substrate 10. Generally, the substrate 10 is doped n-type while the source/drain layer 12 is doped p-type. Silicon compound layer 14 is epitaxially grown to the source/drain layer 12 by the various embodiments of the present invention. A gate oxide layer 18 bridges the either the segmented silicon compound layer 14 (FIG. 1A) or the segmented source/drain layer 12 (FIG. 1B). Generally, gate oxide layer 18 is composed of silicon dioxide, silicon oxynitride or tantalum oxide. Partially encompassing the gate oxide layer 18 is a spacer 16, which is usually an isolation material such as a nitride/oxide stack (e.g., $Si_3N_4$/$SiO_2$/$Si_3N_4$). Also within the spacer 16 is off-set layers 20 (e.g., $Si_3N_4$) and the gate layer 22 (e.g., W or Ni).

In another embodiment, FIG. 1C depicts the deposited silicon compound layer 34 as a base layer of a bipolar transistor. The silicon compound layer 34 is epitaxially grown with the various embodiments of the invention. The silicon compound layer 34 is deposited to an n-type collector layer 32 previously deposited to substrate 30. The transistor further includes isolation layer 33 (e.g., $SiO_2$ or $Si_3N_4$), contact layer 36 (e.g., heavily doped poly-Si), off-set layer 38 (e.g., $Si_3N_4$) and a second isolation layer 40 (e.g., $SiO_2$ or $Si_3N_4$).

Figure 2A:
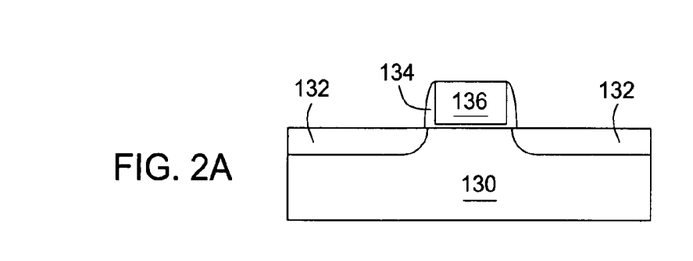
FIGS. 2A–F show schematic illustrations of fabrication techniques for a source/drain extension device within a MOSFET.
Figure 2B:
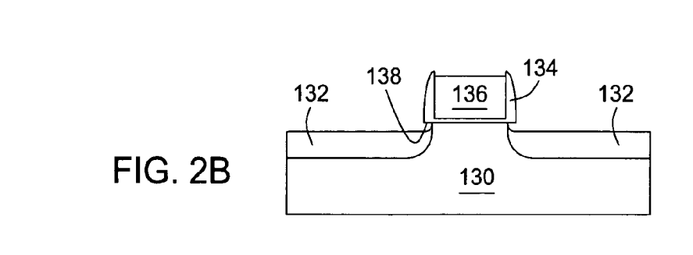

In one embodiment, as depicted in FIGS. 2A–2F, a source/drain extension is formed within a MOSFET wherein the silicon compound layers are epitaxially and selectively deposited on the surface of the substrate. FIG. 2A depicts a source/drain layer 132 formed by implanting ions into the surface of a substrate 130. The segments of source/drain layer 132 are bridged by the gate 136 formed within off-set layer 134. A portion of the source/drain layer is etched and wet-cleaned, to produce a recess 138, as in FIG. 2B.

Figure 2C:
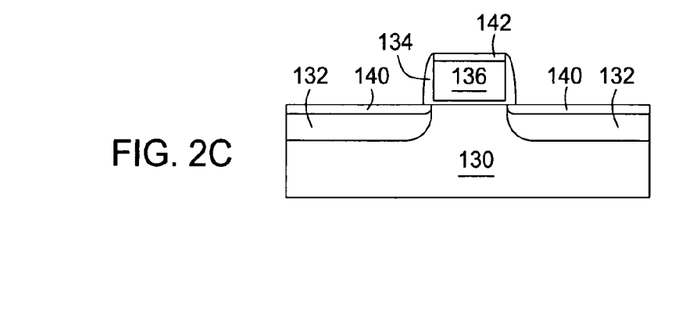

FIG. 2C illustrates several embodiments of the present invention, in which silicon compound layers 140 (epitaxial) and 142 (polycrystalline) are selectively deposited. Silicon compound layers 140 and 142 are deposited simultaneously without depositing on the off-set layer 134. Silicon compound layers 140 and 142 are generally doped SiGe containing layers with a germanium concentration at about 1 atomic percent to about 30 atomic percent, preferably at about 20 atomic percent and a dopant (e.g., B, As or P) concentration from about $1 \times 10^{20}$ atoms/cm$^3$ to about $2.5 \times 10^{21}$ atoms/cm$^3$, preferably at about $2 \times 10^{20}$ atoms/cm$^3$.

Figure 2D:
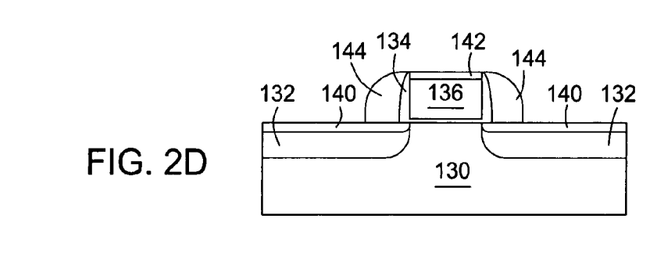

During the next step, FIG. 2D shows the nitride spacer 144 (e.g., $Si_3N_4$) deposited to the off-set layer 134.

Figure 2E:
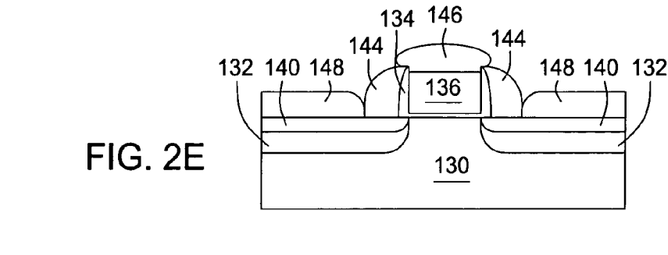

FIG. 2E depicts another embodiment of the present invention, in which a silicon compound is epitaxially and selectively deposited as silicon compound layer 148. Silicon compound layer 148 is deposited on layer 140 (doped-SiGe). Polysilicon layer 146 is deposited on the silicon compound layer 142 (doped-SiGe).

Figure 2F:
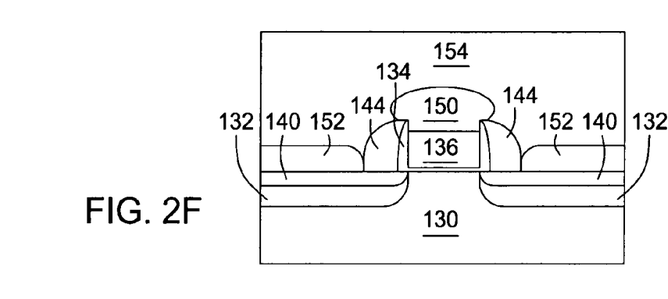

In the next step shown in FIG. 2F, a metal layer 154 is deposited over the features and the device is annealed. The metal layer 154 includes cobalt, nickel or titanium, among other metals. During the annealing process, polysilicon layer 146 and silicon compound layer 148 are converted to metal silicide layers, 150 and 152, respectively. That is, when cobalt is deposited as metal layer 154, then metal silicide layers 150 and 152 are cobalt silicide.

The silicon compound is heavily doped with the in-situ dopants. Therefore, annealing steps of the prior art are omitted and the overall throughput is shorter. An increase of carrier mobility along the channel and subsequent drive current is achieved with the optional addition of germanium and/or carbon into the silicon compound layer. Selectively grown epilayers of the silicon compound above the gate oxide level can compensate junction consumption during the silicidation, which can relieve concerns of high series resistance of ultra shallow junctions. These two applications can be implemented together as well as solely for CMOS device fabrication.

Silicon compounds are utilized within embodiments of the processes to deposit silicon compounds films used for Bipolar (e.g., base, emitter, collector, emitter contact), BiCMOS (e.g., base, emitter, collector, emitter contact) and CMOS (e.g., channel, source/drain, source/drain extension, elevated source/drain, substrate, strained silicon, silicon on insulator and contact plug). Other embodiments of processes teach the growth of silicon compounds films that can be used as gate, base contact, collector contact, emitter contact, elevated source/drain and other uses.

EXAMPLE 1

Boron Doped Silicon Germanium Deposition

A substrate, Si<100>, (e.g., 300 mm OD) was employed to investigate selective, monocrystalline film growth by CVD. A dielectric feature existed on the surface of the wafer. The wafer was prepared by subjecting to a 1% HF dip for 45 seconds. The wafer was loaded into the deposition chamber (Epi Centura® chamber) and baked in a hydrogen atmosphere at 800° C. for 60 seconds to remove native oxide. A flow of carrier gas, hydrogen, was directed towards the substrate and the source compounds were added to the carrier flow. Silane (100 sccm) and germane (6 sccm) were added to the chamber at 15 Torr and 725° C. Hydrogen chloride was delivered with a flow rate of 460 sccm. Diborane was delivered with a flow rate of 1 sccm. The substrate was maintained at 725° C. Deposition was carried out for 5 minutes to form a 500 Å SiGe film with a germanium concentration of 21 atomic percent and the boron concentration was $2.0 \times 10^{20}$ $cm^{-3}$.

EXAMPLE 2

Phosphorus Doped Silicon Germanium Deposition

A substrate was prepared as in Example 1. The wafer was loaded into the deposition chamber (Epi Centura® chamber) and baked in a hydrogen atmosphere at 800° C. for 60 seconds to remove native oxide. A flow of carrier gas, hydrogen, was directed towards the substrate and the source compounds were added to the carrier flow. Silane (100 sccm) and germane (4 sccm) were added to the chamber at 15 Torr and 725° C. Hydrogen chloride was delivered with a flow rate of 250 sccm. Phosphine was delivered to the chamber with a flow rate of 1 sccm. The substrate was maintained at 725° C. Deposition was carried out for 5 minutes to form a 500 Å SiGe film with a germanium concentration of 20 atomic percent and the phosphorus concentration was $1.6 \times 10^{20}$ $cm^{-3}$.

EXAMPLE 3

Boron Doped Silicon Germanium Deposition with Sequential $Cl_2SiH_2$ and $SiH_4$ Flows The substrates were prepared as in Example 1. The wafer was loaded into the deposition chamber (Epi Centura® chamber) and baked in a hydrogen atmosphere at 800° C. for 60 seconds to remove native oxide. A flow of carrier gas, hydrogen, was directed towards the substrate and the source compounds were added to the carrier flow. Dichlorosilane (100 sccm), germane (2.8 sccm), and diborane (0.3 sccm) were added to the chamber at 15 Torr and 725° C. Hydrogen chloride was delivered with a flow rate of 190 sccm. The substrate was maintained at 725° C. Deposition was conducted for 72 seconds to form a first layer of silicon compound with a thickness of 50 Å. On top of the first layer, a subsequent epitaxial layer (i.e., a second layer of silicon compound) was deposited using silane (100 sccm), germane (6 sccm), hydrogen chloride (460 sccm) and diborane (1 sccm). The chamber pressure and temperature remained constant (15 Torr and 725° C.) and the deposition was conducted for 144 seconds to form 250 Å layer of the second layer.

EXAMPLES 4

Boron Doped Silicon Germanium Deposition with Sequential Using $SiH_4$ and $Cl_2SiH_2$ The substrates were prepared as in Example 1. The wafer was loaded into the deposition chamber (Epi Centura® chamber) and baked in a hydrogen atmosphere at 800° C. for 60 seconds to remove native oxide. A flow of carrier gas, hydrogen, was directed towards the substrate and the source compounds were added to the carrier flow. Silane (100 sccm), germane (6 sccm), and diborane (1 sccm) were added to the chamber at 15 Torr and 725° C. Hydrogen chloride was delivered with a flow rate of 460 sccm. The substrate was maintained at 725° C. Deposition was conducted for 144 seconds to form a first layer of silicon compound with a thickness of 250 Å. On top of the first layer, a second layer of silicon compound was sequentially deposited using dichlorosilane (100 sccm), germane (2.8 sccm), hydrogen chloride (190 sccm) and diborane (0.3 sccm). The chamber pressure and temperature remained constant (15 Torr and 725° C.) was conducted for 72 seconds to form additional 50 Å layer.

While the foregoing is directed to embodiments of the present invention, other and further embodiments of the invention may be devised without departing from the basic scope thereof, and the scope thereof is determined by the claims that follow.

The invention claimed is:

1. A method for depositing a silicon germanium film on a substrate comprising:
   providing a substrate within a process chamber;
   heating the substrate to a temperature within a range from about 500° C. to about 900° C.;
   exposing the substrate to a first deposition gas comprising silane, germanium, a carbon source, hydrogen chloride, a carrier gas, and at least one dopant gas to epitaxially and selectively deposit a first silicon germanium material on the substrate, wherein the first silicon germanium material contains a dopant concentration of about $2.5 \times 10^{21}$ atoms/cm$^3$; and
   exposing the substrate to a second deposition gas comprising dichlorosilane and a germanium source to epitaxially and selectively deposit a second silicon germanium material on the substrate.

2. The method of claim 1, wherein the at least one dopant gas is a boron containing compound selected from the group consisting of borane, diborane, triborane, trimethylborane, triethylborane, and derivatives thereof.

3. The method of claim 2, wherein the first silicon germanium material contains a boron concentration of about $2.5 \times 10^{21}$ atoms/cm$^3$.

4. The method of claim 3, wherein the carbon source is an organosilane.

5. The method of claim 4, wherein the carbon source is methylsilane.

6. The method of claim 1, wherein the at least one dopant gas includes an arsenic containing compound or a phosphorus containing compound.

7. The method of claim 1, wherein the carrier gas is selected from the group consisting of hydrogen, argon, nitrogen, helium, and combinations thereof.

8. The method of claim 7, wherein the first deposition gas further comprises dichlorosilane.

9. The method of claim 7, wherein the temperature is within a range from about 600° C. to about 750° C. and the process chamber is at a pressure within a range from about 0.1 Torr to about 200 Torr.

10. The method of claim 7, wherein the silicon germanium film has a thickness within a range from about 100 Å to about 3,000 Å.

11. The method of claim 10, wherein the silicon germanium film is deposited within a device used for CMOS, Bipolar, or BiCMOS application.

12. The method of claim 11, wherein the silicon germanium film is deposited during a fabrication step selected from the group consisting of contact plug, source/drain extension, elevated source/drain, and bipolar transistor.

13. The method of claim 1, wherein a silicon-containing material is deposited on the substrate before the first silicon germanium material.

14. The method of claim 13, wherein the silicon-containing material is deposited by a deposition process comprising dichlorosilane.

15. A selective epitaxial method for depositing a silicon germanium film on a substrate comprising:
   placing a substrate within a process chamber;
   heating the substrate to a temperature within a range from about 500° C. to about 900° C.; and
   exposing the substrate to a deposition gas comprising silane, a germanium source, a carbon source, an etchant source, a carrier gas, and at least one dopant gas to epitaxially and selectively form a silicon germanium material containing a dopant concentration of about $2.5 \times 10^{21}$ atoms/cm$^3$.

16. The method of claim 15, wherein the germanium source is selected from the group consisting of germane, digermane, trigermane, tetragermane, and derivatives thereof.

17. The method of claim 16, wherein the carrier gas is selected from the group consisting of hydrogen, argon, nitrogen, helium, and combinations thereof.

18. The method of claim 17, wherein the temperature is within a range from about 600° C. to about 750° C. and the process chamber is at a pressure within a range from about 0.1 Torr to about 200 Torr.

19. The method of claim 18, wherein the etchant source is selected from the group consisting of hydrogen chloride, tetrachlorosilane, tetrachloromethane, dichloromethane, chlorine, derivatives thereof, and combinations thereof.

20. The method of claim 15, wherein the at least one dopant gas is a boron containing compound selected from the group consisting of borane, diborane, triborane, trimethylborane, triethylborane, and derivatives thereof.

21. The method of claim 20, wherein the carbon source is an organosilane.

22. The method of claim 21, wherein the carbon source is methylsilane.

23. The method of claim 15, wherein the at least one dopant gas is selected from the group consisting of an arsenic containing compound and a phosphorus containing compound.

24. The method of claim 15, wherein the deposition gas further comprises dichlorosilane.

25. The method of claim 18, wherein the silicon germanium film has a thickness within a range from about 100 Å to about 3,000 Å.

26. The method of claim 25, wherein the silicon germanium film is deposited within a device used for CMOS, Bipolar, or BiCMOS application.

27. The method of claim 26, wherein the silicon germanium film is deposited during a fabrication step selected from the group consisting of contact plug, source/drain extension, elevated source/drain, and bipolar transistor.

28. The method of claim 15, wherein the silicon germanium material is deposited having a first thickness, thereafter, the silane is replaced by dichlorosilane, and a second silicon germanium material is epitaxially and selectively deposited having a second thickness on the silicon germanium material.

29. The method of claim 15, wherein a silicon-containing material is deposited on the substrate before the silicon germanium material.

30. The method of claim 29, wherein the silicon-containing material is deposited by a deposition process comprising dichlorosilane.

31. A method for depositing a silicon germanium film on a substrate comprising:
   placing a substrate within a process chamber;
   heating the substrate to a temperature within a range from about 500° C. to about 900° C.; and
   exposing the substrate to a deposition gas comprising a silicon-containing gas, a germanium source, a carbon source, hydrogen chloride, and a boron-containing dopant gas to epitaxially and selectively deposit a silicon germanium material on the substrate, wherein the silicon germanium material contains a boron concentration of about $2.5 \times 10^{21}$ atoms/cm$^3$.

32. A method for depositing a silicon germanium film on a substrate comprising:
  placing a substrate within a process chamber;
  exposing the substrate to a first deposition gas comprising silane, a first germanium source, a carbon source, hydrogen chloride, and a carrier gas to epitaxially deposit a first silicon germanium containing material having a first thickness on the substrate and containing a dopant concentration of about $2.5 \times 10^{21}$ atoms/cm$^3$; and
  exposing the substrate to a second deposition gas comprising dichlorosilane and a second germanium source to epitaxially deposit a second silicon germanium containing material having a second thickness on the first silicon germanium containing material.

33. The method of claim 32, wherein the first silicon germanium containing material is selectively deposited on the substrate.

34. The method of claim 33, wherein the first deposition gas further comprises at least one dopant gas.

35. The method of claim 34, wherein the at least one dopant gas comprises an element selected from the group consisting boron, arsenic, phosphorus, and combinations thereof.

36. The method of claim 35, wherein the at least one dopant gas comprises a boron containing compound selected from the group consisting of borane, diborane, triborane, trimethylborane, triethylborane, and derivatives thereof.

37. The method of claim 36, wherein the carbon source is an organosilane.

38. The method of claim 37, wherein the carbon source is methylsilane.

39. The method of claim 33, wherein the second silicon germanium containing material is selectively deposited on the substrate.

40. The method of claim 39, wherein the second deposition gas further comprises hydrogen chloride and at least one dopant gas.

41. The method of claim 40, wherein the at least one dopant gas comprises an element selected from the group consisting boron, arsenic, phosphorus, and combinations thereof.

42. The method of claim 41, wherein the at least one dopant gas comprises a boron containing compound selected from the group consisting of borane, diborane, triborane, trimethylborane, triethylborane, and derivatives thereof.

43. The method of claim 33, wherein the first and second germanium sources are independently selected from the group consisting of germane, digermane, trigermane, tetragermane, and derivatives thereof.

44. The method of claim 43, wherein the first and second thicknesses are independently within a range from about 100 Å to about 3,000 Å.

45. The method of claim 44, wherein the substrate is heated to a first temperature during the exposure of the first deposition gas and to a second temperature during the exposure of the second deposition gas, wherein the first and second temperatures are independently a temperature within a range from about 500° C. to about 900° C.

* * * * *

UNITED STATES PATENT AND TRADEMARK OFFICE
CERTIFICATE OF CORRECTION

PATENT NO.       : 7,166,528 B2  
APPLICATION NO. : 10/683937  
DATED            : January 23, 2007  
INVENTOR(S)      : Kim et al.

It is certified that error appears in the above-identified patent and that said Letters Patent is hereby corrected as shown below:

Column 9, Line 2: Change "O" to --0--

Column 9, Line 18: Change "Material" to --Materials--

Column 9, Line 65: Change "Material" to --Materials--

Column 15, Claim 35, Line 23: After "consisting", insert --of--

Column 16, Claim 41, Line 10: After "consisting", insert --of--

Signed and Sealed this

Nineteenth Day of June, 2007

JON W. DUDAS  
*Director of the United States Patent and Trademark Office*